US011107524B2

(12) United States Patent
Lee et al.

(10) Patent No.: US 11,107,524 B2
(45) Date of Patent: Aug. 31, 2021

(54) METHODS AND APPARATUS FOR RESISITIVE MEMORY DEVICE FOR SENSE MARGIN COMPENSATION

(71) Applicant: SAMSUNG ELECTRONICS CO., LTD., Suwon-si (KR)

(72) Inventors: Do Jeon Lee, Hwaseong-si (KR); Tae Hui Na, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/786,609

(22) Filed: Feb. 10, 2020

(65) Prior Publication Data

US 2021/0035634 A1 Feb. 4, 2021

(30) Foreign Application Priority Data

Jul. 29, 2019 (KR) ........................ 10-2019-0091660

(51) Int. Cl.
*G11C 13/00* (2006.01)
(52) U.S. Cl.
CPC ........ *G11C 13/0004* (2013.01); *G11C 13/004* (2013.01); *G11C 13/0026* (2013.01); *G11C 13/0028* (2013.01); *G11C 13/0038* (2013.01); *G11C 2213/72* (2013.01)
(58) Field of Classification Search
CPC ............ G11C 13/0004; G11C 13/0028; G11C 13/0026; G11C 13/004; G11C 13/0038; G11C 2213/72
See application file for complete search history.

(56) References Cited

U.S. PATENT DOCUMENTS

| | | | |
|---|---|---|---|
| 7,668,006 B2 | 2/2010 | Lee et al. | |
| 8,054,679 B2 | 11/2011 | Nakai et al. | |
| 8,681,540 B2 | 3/2014 | Zeng | |
| 8,917,534 B2 | 12/2014 | Castro | |
| 9,142,271 B1* | 9/2015 | Srinivasan | G11C 13/0028 |
| 9,286,975 B2 | 3/2016 | Chu et al. | |
| 9,437,293 B1* | 9/2016 | Kripanidhi | G11C 13/0069 |
| 9,633,723 B2 | 4/2017 | Nguyen et al. | |
| 9,747,978 B2 | 8/2017 | Srinivasan et al. | |
| 2011/0080775 A1* | 4/2011 | Bae | G11C 11/5678 365/163 |
| 2016/0180928 A1* | 6/2016 | Kim | G11C 13/0033 711/125 |
| 2018/0108407 A1* | 4/2018 | Ham | G11C 13/0004 |
| 2019/0378567 A1* | 12/2019 | Gangasani | G11C 13/0033 |
| 2020/0090745 A1* | 3/2020 | Gangasani | G11C 13/0028 |

* cited by examiner

*Primary Examiner* — Mushfique Siddique
(74) *Attorney, Agent, or Firm* — Sughrue Mion, PLLC

(57) ABSTRACT

A resistive memory device is provided. The resistive memory device includes a resistive memory cell electrically connected to a local word line node; a local word line transistor configured to electrically connect the local word line node to a global word line node; a global word line transistor configured to electrically connect the global word line node to a sensing node; and a margin compensation circuit comprising a margin compensation switch electrically connected to the local word line node and the global word line node.

14 Claims, 17 Drawing Sheets

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(2_1) | | SA/WD(2_2) | | SA/WD(2_3) | | SA/WD(2_4) | |
| | PERIPHERY(3) | | | | | | | |
| | SA/WD(2_8) | | SA/WD(2_7) | | SA/WD(2_6) | | SA/WD(2_5) | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

METHODS AND APPARATUS FOR RESISITIVE MEMORY DEVICE FOR SENSE MARGIN COMPENSATION

CROSS-REFERENCE TO THE RELATED APPLICATION

This application claims priority from Korean Patent Application No. 10-2019-0091660, filed on Jul. 29, 2019 in the Korean Intellectual Property Office, the contents of which are incorporated herein by reference in its entirety.

BACKGROUND

1. Field

Methods and apparatuses consistent with embodiments relate to a resistive memory device.

2. Related Art

Examples of nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM becomes a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1. However, charge sharing due to a parasitic capacitance may reduce reliability of a memory device.

SUMMARY

Provided is a resistive memory device having improved read reliability.

The present disclosure is not restricted to the embodiments set forth herein.

According to an aspect of an embodiment, there is provided a resistive memory device including: a resistive memory cell electrically connected to a local word line node; a local word line transistor configured to electrically connect the local word line node to a global word line node; a global word line transistor configured to electrically connect the global word line node to a sensing node; and a margin compensation circuit comprising a margin compensation switch electrically connected to the local word line node and the global word line node.

According to an aspect of an embodiment, there is provided a resistive memory device including: a resistive memory cell electrically connected to a bit line and a word line, the resistive memory cell being connected to the word line at a local word line node, and the resistive memory cell comprising an access element having a first threshold voltage; a local word line transistor configured to electrically connect the local word line node to a global word line node from a first time point to a second time point to pre-charge the word line to a pre-charge voltage; a global word line transistor configured to electrically connect the global word line node to a sensing node; and a word line pre-charge circuit configured to generate the pre-charge voltage and provide the pre-charge voltage to the sensing node. The local word line transistor is further configured to maintain an off state after the second time point while the global word line transistor electrically connects the global word line node to the sensing node.

According to an aspect of an embodiment, there is provided a resistive memory device including: a power source; a resistive memory cell electrically connected to a local bit line node and local word line node; a clamping circuit configured to provide a clamping voltage based on power received from the power source; a global bit line transistor configured to receive the clamping voltage from the clamping circuit; a local bit line transistor configured to receive the clamping voltage from the global bit line transistor and provide the clamping voltage to the resistive memory cell; a local word line transistor interposed between a local word line node and a global word line node; a global word line transistor interposed between the global word line node and a sensing node; a margin compensation circuit electrically connected to the local word line node and the global word line node, the margin compensation circuit comprising a margin compensation switch; a word line pre-charge circuit electrically connected to the sensing node; and a sense amplifier comprising a first terminal connected to the sensing node and a second terminal connected to a reference node.

BRIEF DESCRIPTION OF THE DRAWINGS

The above and other aspects and features will become more apparent from the following description taken in conjunction with the attached drawings, in which:

FIG. 1 is a block diagram illustrating a resistive memory device according to some embodiments.

DETAILED DESCRIPTION

FIG. 1 is a block diagram illustrating a resistive memory device according to some embodiments. In the following description, a resistive memory device including sixteen memory banks is illustrated as an example in FIG. 1, but the present disclosure is not limited thereto.

Referring to FIG. 1, a resistive memory device according to some embodiments includes a resistive memory cell array, a plurality of sense amplifiers and write drivers (SA/WD) 2_1 to 2_8, and a peripheral circuit region 3.

The resistive memory cell array may include a plurality of memory banks 1_1 to 1_16, and each of the memory banks 1_1 to 1_16 may include a plurality of memory blocks BLK0 to BLK7. Each of the memory blocks BLK0 to BLK7 includes a plurality of resistive memory cells arranged in a matrix. In the following description, an example where each of the memory banks 1_1 to 1_16 includes eight memory blocks is illustrated, but the present disclosure is not limited thereto.

A row select circuit and a column select circuit may be disposed to correspond to each of the memory banks 1_1 to 1_16. The row select circuit and the column select circuit respectively designate a row and a column of resistive memory cells to be written to and read from.

Each of the sense amplifiers and write drivers 2_1 to 2_8 is disposed to correspond to two of the memory banks 1_1 to 1_16 and executes read and write operations on the two corresponding memory banks. In the embodiments of the present disclosure, a case where each of the sense amplifiers and write drivers 2_1 to 2_8 corresponds to two of the memory banks 1_1 to 1_16 is used as an example, but the present disclosure is not limited thereto. That is, each of the sense amplifiers and write drivers 2_1 to 2_8 may correspond to one memory bank or four memory banks.

Further, in each of the sense amplifiers and write drivers 2_1 to 2_8, the number of the sense amplifiers and the number of the write drivers may be different from each other. In particular, the number of the sense amplifiers may be larger than the number of the write drivers.

In the peripheral circuit region 3, a plurality of logic circuit blocks and a power source may be disposed to operate the column select circuit, the row select circuit, and the sense amplifiers and write drivers 2_1 to 2_8.

Figure 2:
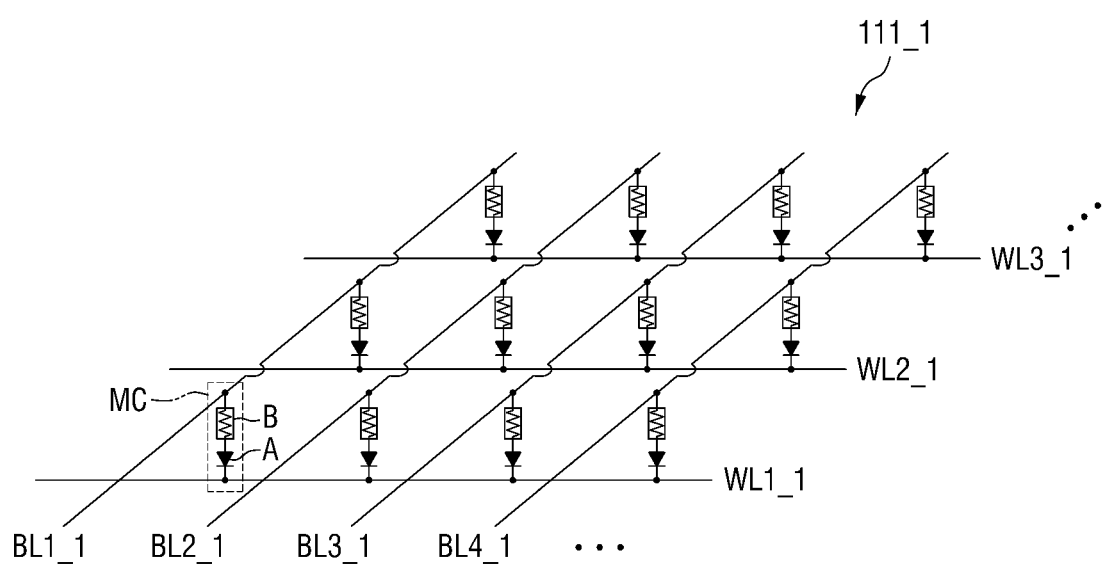
FIGS. 2 to 4 are diagrams illustrating the resistive memory cell array of FIG. 1, according to some embodiments.
Figure 3:
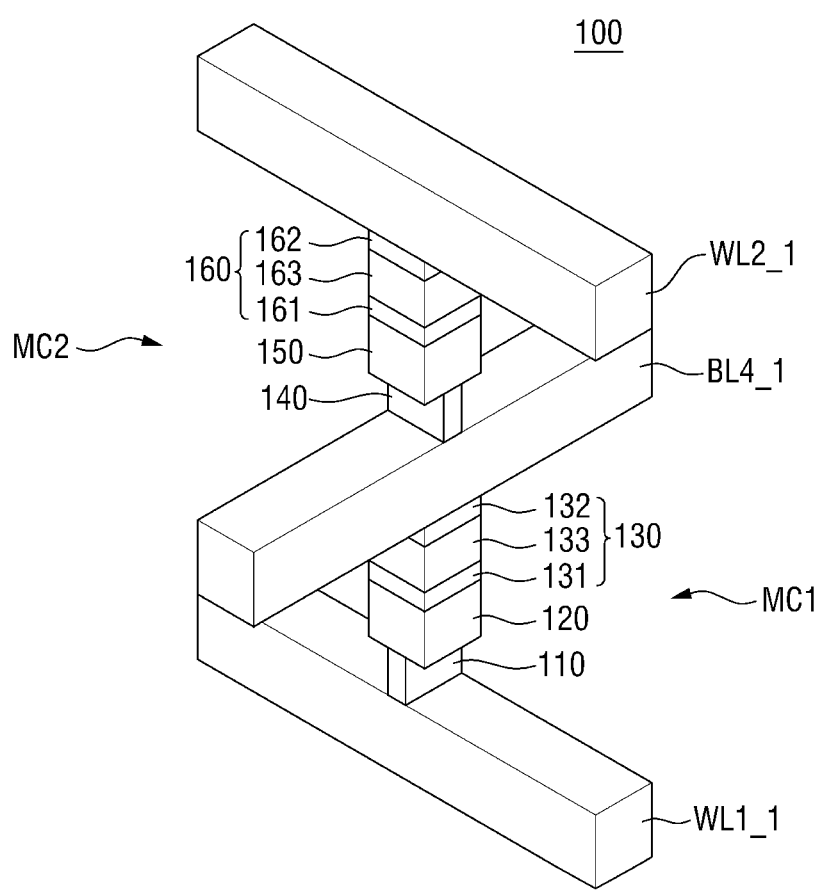
Figure 4:
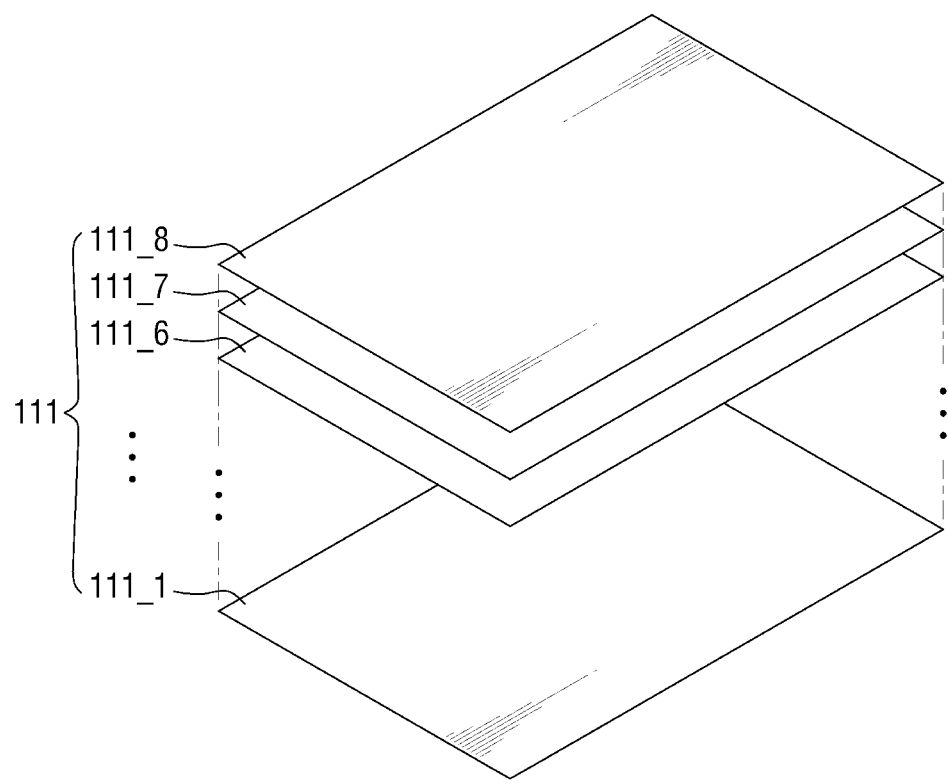

FIGS. 2 to 4 are diagrams illustrating the resistive memory cell array of FIG. 1, according to some embodiments.

Referring to FIG. 2, the resistive memory cell array may have a cross point structure. The cross point structure refers to a structure in which one resistive memory cell MC is formed in a region where one line and another line cross each other. For example, bit lines BL1_1 to BL4_1 may extend in a first direction, and word lines WL1_1 to WL3_1 may extend in a second direction to cross the bit lines BL1_1 to BL4_1. A resistive memory cell MC may be formed in a region in which each of the bit lines BL1_1 to BL4_1 crosses each of the word lines WL1_1 to WL3_1. Each of the resistive memory cells MC may include a variable resistance element B and an access element A controlling the current flowing through the variable resistance element B.

Referring to FIG. 3, a memory cell 100 of the resistive memory cell array according to some embodiments may include a first memory cell MC1 disposed between one word line (e.g., WL1_1) and one bit line (e.g., BL4_1), and a second memory cell MC2 disposed between another word line (e.g., WL2_1) and one bit line (e.g., BL4_1). The first memory cell MC1 and the second memory cell MC2 may operate as independent memory cells, respectively.

The first memory cell MC1 may include a first heating electrode 110, a first information storage element 120, a first switch element 130, and the like. The first switch element 130 may include a first switch electrode 131, a second switch electrode 132, and a first selection layer 133 disposed there between. In some embodiments, the first selection layer 133 may include an ovonic threshold switch (OTS) material. When a voltage greater than a threshold voltage is applied between the first switch electrode 131 and the second switch electrode 132, a current may flow through the first selection layer 133.

The cross-sectional area of the first heating electrode 110 may be the same as or different from the cross-sectional area of the first information storage element 120 in the direction in which the first heating electrode 110 and the first information storage element 120 are in contact with each other. When the cross-sectional area of the first heating electrode 110 is different from the cross-sectional area of the first information storage element 120 in the direction in which the first heating electrode 110 and the first information storage element 120 are in contact with each other, the temperature applied to the first memory cell MC1 during the operation of the semiconductor device may vary, and in this case, a process may be added or changed.

In some embodiments, the first memory cell MC1 may not include the first heating electrode 110.

The first information storage element 120 may include a phase-change material. In some embodiments, the first information storage element 120 may include a chalcogenide material, but embodiments are not limited thereto. In some other embodiments, the first information storage element 120 may include, for example, Ge—Sb—Te (GST). According to types of elements included in the first information storage element 120 and the chemical composition ratio, the crystallization temperature, the melting point and the phase-change rate according to the crystallization energy of the first information storage element 120 may be determined.

The second memory cell MC2 may have a structure similar to that of the first memory cell MC1. The second memory cell MC2 may include a second heating electrode 140, a second information storage element 150, a second switch element 160, and the like. The structures and the characteristics of the second heating electrode 140, the second information storage element 150 and the second switch element 160 may be similar to those of the first heating electrode 110, the first information storage element 120 and the first switch element 130, respectively. The second switch element 160 may include a first switch electrode 161, a second switch electrode 162, and a selection layer 163 disposed there between.

In some embodiments, the second memory cell MC2 may not include the second heating electrode 140.

The resistive memory cell array according to some embodiments may have a three-dimensional (3D) stacked structure, as shown in FIG. 4. The 3D stacked structure refers to a structure in which a plurality of resistive memory cell layers 111_1 to 111_8 are vertically stacked. Although it is illustrated in the drawing that eight resistive memory cell layers 111_1 to 111_8 are stacked, the present disclosure is not limited thereto. Each of the resistive memory cell layers 111_1 to 111_8 may include a plurality of resistive memory cell groups and/or a plurality of redundancy memory cell groups. If the resistive memory cell array has a 3D stacked structure, each of the resistive memory cell layers 111_1 to 111_8 may have the cross point structure of FIG. 2. However, the present disclosure is not limited thereto.

When the resistive memory cells of the resistive memory cell layers 111_1 to 111_8 are PRAMs, the resistive memory cell MC may include a variable resistance element B including a phase-change material and an access element A controlling the current flowing through the variable resistance element B. Here, the access element A may be a diode or transistor connected in series to the variable resistance element B.

Examples of the phase-change material may include a combination of two elements such as GaSb, InSb, InSe, $Sb_2Te_3$ or GeTe, a combination of three elements such as GeSbTe, GaSeTe, InSbTe, $SnSb_2Te_4$ or InSbGe, and a combination of four elements such as AgInSbTe, (GeSn)SbTe, GeSb(SeTe) or $Te_{81}Ge_{15}Sb_2S_2$. Among them, GeSbTe that contains germanium (Ge), antimony (Sb), and tellurium (Te) may typically be used for the phase-change material.

When the resistive memory cells of the resistive memory cell layers 111_1 to 111_8 are RRAMs, the variable resistance element B may include NiO or perovskite, for example. The perovskite may be a composition such as manganite ($Pr_{0.7}Ca_{0.3}MnO_3$, $Pr_{0.5}Ca_{0.5}MnO_3$, other PCMO, LCMO, etc.), titanate (STO:Cr), or zirconate (SZO:Cr, $Ca_2Nb_2O_7$:Cr, $Ta_2O_5$:Cr). A filament may be formed in a variable resistance element GST.

In the resistive memory cell layers 111_1 to 111_8 according to some embodiments, bit lines and/or word lines may be shared between adjacent resistive memory cell layers (e.g., 111_7 and 111_8).

Figure 5:
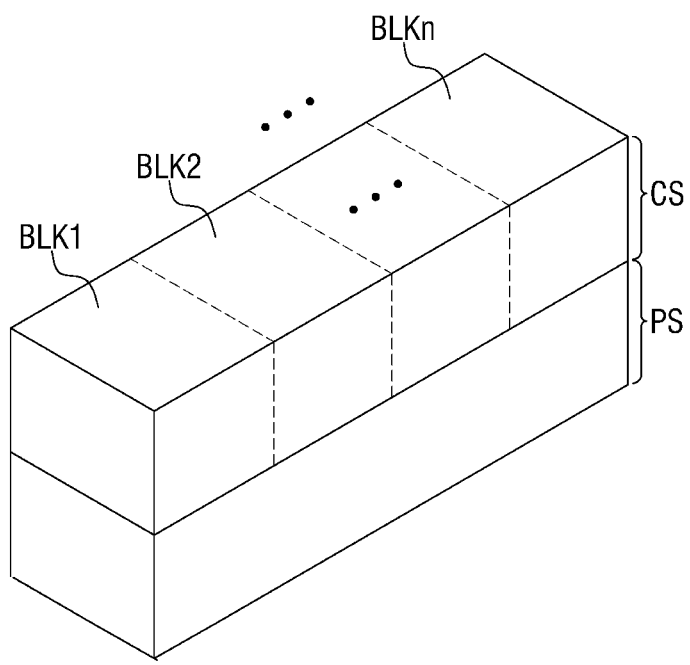
FIG. 5 is another block diagram illustrating a resistive memory device according to some embodiments.

FIG. 5 is a block diagram illustrating a resistive memory device according to some embodiments.

Referring to FIG. 5, a resistive memory device according to some embodiments may include a peripheral logic structure PS and a cell array structure CS.

The cell array structure CS may be stacked on the peripheral logic structure PS. That is, the peripheral logic structure PS and the cell array structure CS may overlap each other in plan view. The resistive memory device according to some embodiments may have a cell over peri (COP) structure.

For example, the cell array structure CS may include the resistive memory cell array of FIGS. 2 to 4. The peripheral logic structure PS may include the peripheral circuit region 3 of FIG. 1.

The cell array structure CS may include a plurality of memory cell blocks BLK1 to BLKn disposed on the peripheral logic structure PS.

Figure 6:
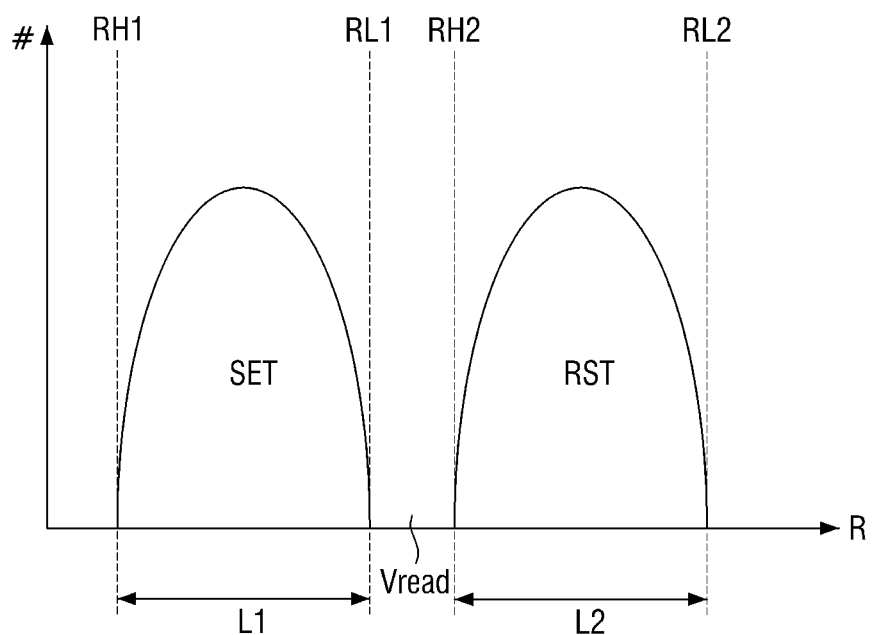
FIG. 6 is a graph illustrating a resistance distribution of a resistive memory cell of a resistive memory device according to some embodiments.

FIG. 6 is a graph illustrating a resistance distribution of a resistive memory cell of a resistive memory device according to some embodiments.

Referring to FIG. 6, the resistive memory cell may be, for example, a single bit cell. The resistive memory cell may be a multi-bit cell. However, the present disclosure is not limited thereto. Hereinafter, it is assumed that the resistive memory cell is a single bit cell.

The resistive memory cell may store either first data SET or second data RST. The resistance distribution shown in FIG. 6 may be a distribution immediately after the write operation.

The first data SET and the second data RST may correspond to a first resistance level L1 and a second resistance level L2, respectively. The resistance value may increase in the order of the first resistance level L1 and the second resistance level L2. For example, the first resistance level L1 is smaller than RL1, and the second resistance level L2 is greater than RH1 and smaller than RL2. Here, RL1, RL2, RH1 and RH2 may be reference values used in a verify read operation for checking whether the write is correctly performed during the write operation.

In the resistance distribution illustrated in FIG. 6, in the resistive memory cell array, based on a reference voltage or a read voltage Vread, the SET state may correspond to a case where the variable resistance element has a crystalline state. The RESET state may correspond to a case where the variable resistance element has an amorphous state.

Figure 7:
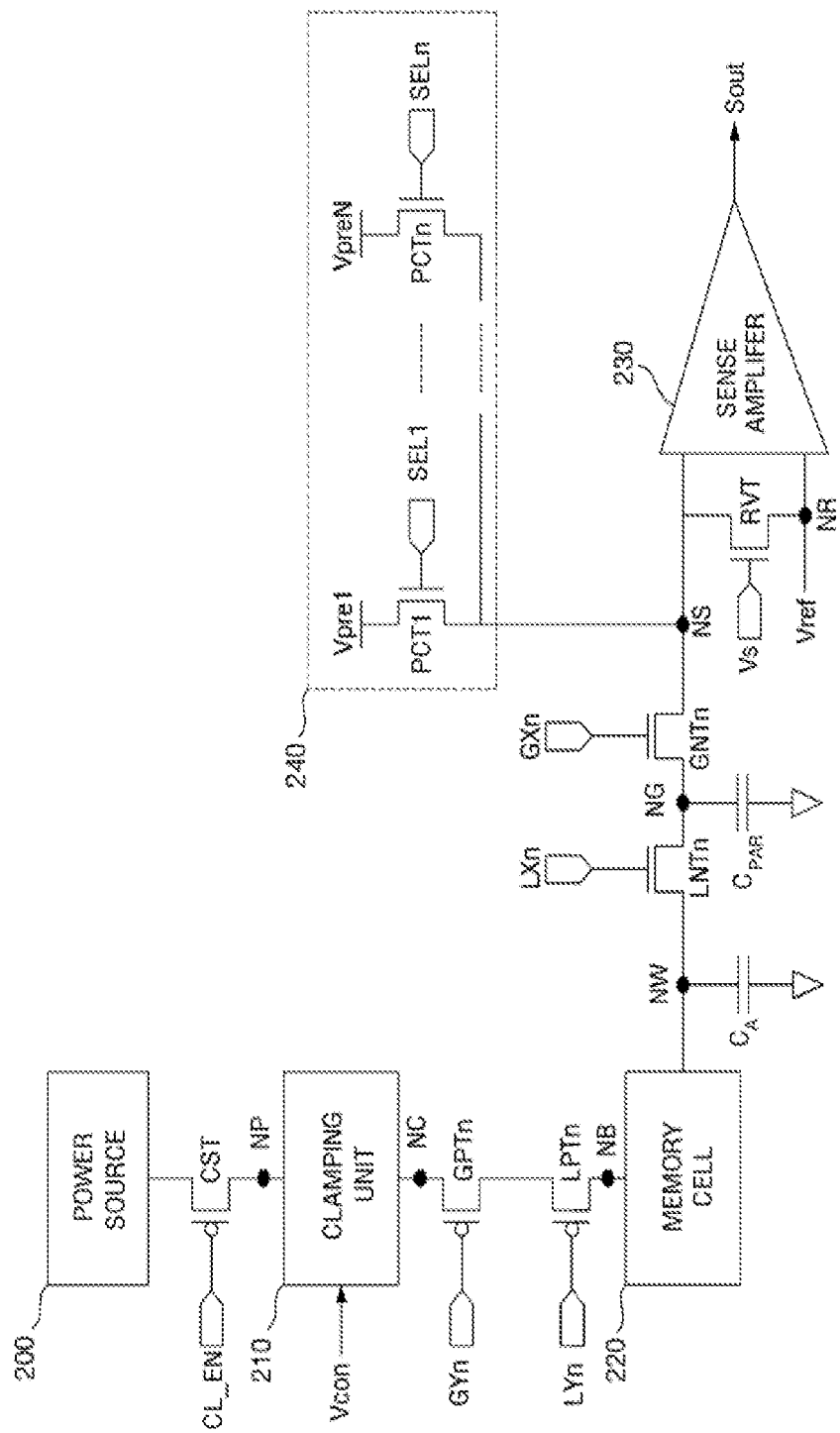
FIG. 7 is a block diagram illustrating a resistive memory device.

FIG. 7 is a block diagram illustrating a resistive memory device for sensing charges.

Referring to FIG. 7, the resistive memory device may include a power source 200, a clamping switching transistor CST, a clamping unit 210, a global bit line transistor GPTn, a local bit line transistor LPTn, a resistive memory cell 220, a charging capacitor $C_A$, a local word line transistor LNTn, a parasitic capacitance $C_{PAR}$, a global word line transistor GNTn, a sense amplifier 230, a reference voltage transistor RVT, and a pre-charge unit 240.

The resistive memory cell 220 is one of a plurality of resistive memory cells in the memory cell array and may be selected to be read from among the plurality of resistive memory cells. Because the resistive memory cell 220 is the same as the resistive memory cell MC of FIG. 2 described above, a detailed description thereof will be omitted.

The power source 200 may supply a power supply voltage to the clamping unit 210 through a power node NP. In this case, the clamping switching transistor CST connected between the power source 200 and the clamping unit 210 may be turned on or off through a clamping activation signal CL_EN to transmit the power supply voltage supplied from the power source 200 to the power node NP, or block transmission of the power supply voltage to the power node NP.

The clamping unit 210 may receive a power supply voltage VP from the power source 200. The clamping unit 210 may clamp the power supply voltage VP received from the power source 200 to a clamping voltage VC for pre-charging the bit line. Specifically, the clamping unit 210 may receive a clamping control voltage Vcon from the outside and transmit the clamping voltage VC to a clamping node NC. For example, the clamping unit 210 may include a circuit structure as shown in FIG. 8.

Figure 8:
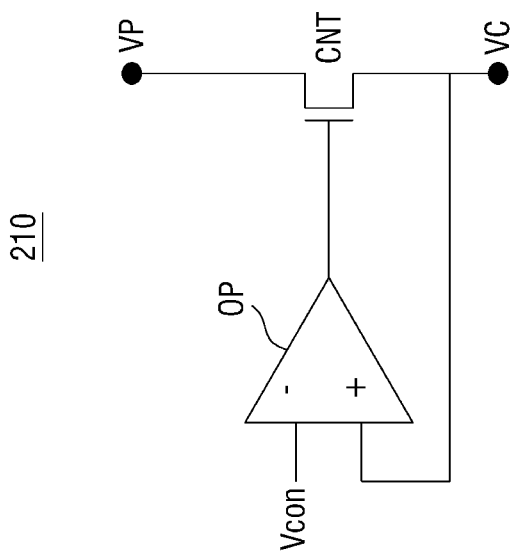
FIG. 8 is an exemplary circuit diagram of a clamping unit of FIG. 7.

FIG. 8 is an exemplary circuit diagram of the clamping unit 210. As illustrated in FIG. 7, the clamping unit 210 may be connected between the global bit line transistor GPTn and the power node NP. Specifically, the clamping unit 210 includes a clamping transistor CNT to which the power supply voltage VP is applied. An OP amplifier OP is connected to the gate of the clamping transistor CNT. The clamping control voltage Vcon is applied to a negative input terminal (−) of the OP amplifier. The clamping voltage may be applied to a positive input terminal (+) of the OP amplifier.

Referring again to FIG. 7, the global bit line transistor GPTn may receive the clamping voltage VC from the clamping node NC. The global bit line transistor GPTn may receive a global bit line control voltage GYn to transmit the clamping voltage VC to the local bit line transistor LPTn. A plurality of local bit line transistors LPTn may be connected to one global bit line transistor GPTn.

The local bit line transistor LPTn may receive the clamping voltage VC from the global bit line transistor GPTn. The local bit line transistor LNTn may receive a local bit line control voltage LYn to transmit the clamping voltage VC to a bit line node NB.

The bit line of the resistive memory cell 220 may receive the clamping voltage VC from the local bit line transistor LPTn such that the clamping voltage VC is pre-charged to the bit line node NB after a predetermined time point. After a certain time period, the bit line node NB may be pre-charged to the clamping voltage VC. An operation over time will be described in detail later with reference to FIGS. 9 and 10.

The pre-charge unit 240 includes first to n-th pre-charge transistors PCT1 to PCTn. Each gate of the pre-charge transistors PCT1 to PCTn may be configured to receive a corresponding selection signal, and one pre-charge voltage of first to n-th pre-charge voltages Vpre1 to VpreN may be transmitted to a sensing node NS based on which of the pre-charge transistors PCT1 to PCTn is selected. For example, the first pre-charge transistor PCT1 may be turned on by selection signal SEL1, transmitting first pre-charge voltage Vpre1 to the sensing node NS.

The global word line transistor GNTn may be gated by the global word line control voltage GXn to transmit the pre-charge voltage received through the sensing node NS to a global word line node NG.

The local word line transistor LNTn may be gated by the local word line control voltage LXn to transmit the pre-charge voltage to a local word line node NW through the global word line node NG.

The word line of the resistive memory cell 220 may receive a pre-charge voltage from the local word line transistor LNTn such that the pre-charge voltage is pre-charged to the local word line node NW after a predetermined time point. After a certain time period, the local word line node NW may be pre-charged to a pre-charge voltage. An operation over time will be described in detail later with reference to FIGS. 9 and 10.

Subsequently, when the voltage between the bit line node NB and the local word line node NW is greater than or equal to the threshold voltage of the resistive memory cell 220, charges of the bit line node NB may be transferred to the local word line node NW. In this process, the charges accumulated in the local word line node NW may be accumulated in the charging capacitor $C_A$. An operation over time will be described in detail later with reference to FIGS. 9 and 10.

The sense amplifier 230 may receive a reference voltage Vref from a reference node NR, and output a sensing output value Sout by comparing the reference voltage Vref with the voltage of the sensing node NS. At an arbitrary time point after the time point of pre-charging the bit line node NB with the pre-charge voltage, the reference voltage transistor RVT may be gated by the switching voltage VS to make the voltage of the reference node NR equal to the voltage of the sensing node NS. The reference voltage transistor RVT may be an NMOS transistor, but is not limited thereto, and may be a PMOS transistor or a transfer transistor. The voltage of the sensing node NS or the voltage of the reference node NR (made to be equal) may be compared with the voltage of the local word line node NW obtained through the charges accumulated in the charging capacitor $C_A$. The voltage of the local word line node NW may be transmitted to the sensing node NS through the local word line transistor LNTn and the global word line transistor GNTn. The sense amplifier 230 may output the sensing output value Sout by determining whether the resistive memory cell 220 is in the SET state or the RST state described with reference to FIG. 6 through the voltage transmitted to the sensing node NS, which may be simply referred to as charge sensing.

However, a parasitic capacitance may be formed in the global word line node NG by transistors around the global word line node NG. Accordingly, a problem may occur when the local word line transistor LNTn is turned on to move the charges of the charging capacitor $C_A$ to the sense amplifier 230. That is, because a charge sharing phenomenon occurs between the charging capacitor $C_A$ and the parasitic capacitance $C_{PAR}$, the charges charged in the charging capacitor $C_A$ are preserved and cannot be transferred to the sense amplifier 230. In the charge sensing, when the charging capacitor $C_A$ shares charges with the parasitic capacitance $C_{PAR}$ by the law of charge preservation, the sensing margin of the resistive memory device may decrease. This will be described with reference to the time-dependent graph of FIGS. 9 to 10.

Figure 9:
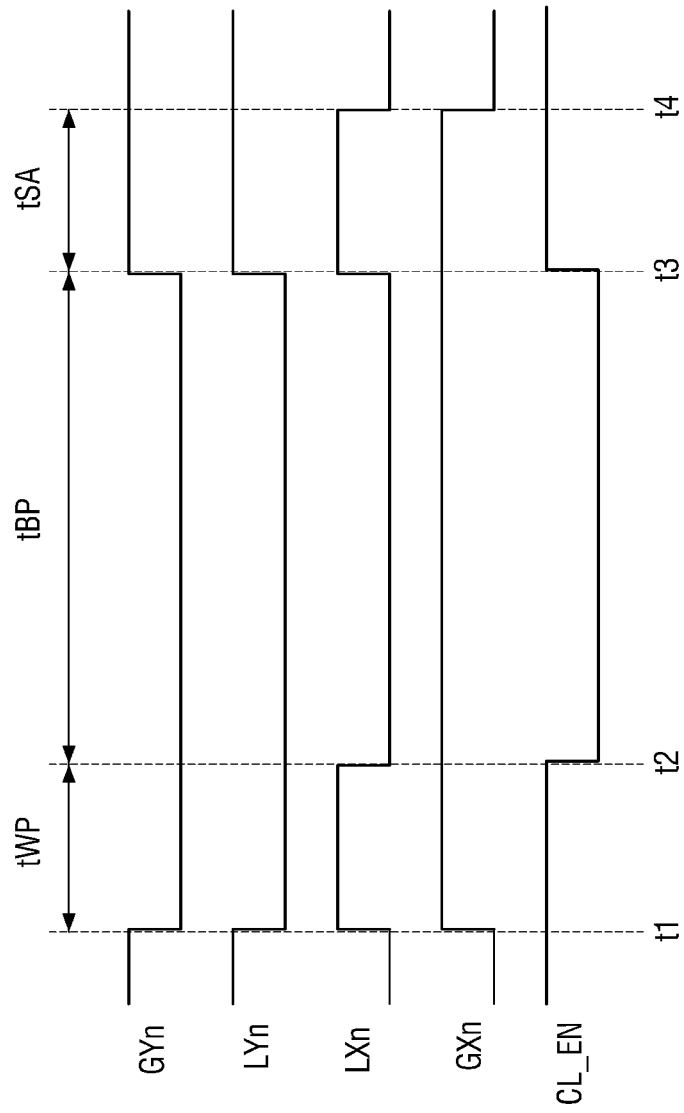
FIG. 9 is a timing diagram explaining an operation of the resistive memory device of FIG. 7.
Figure 10:
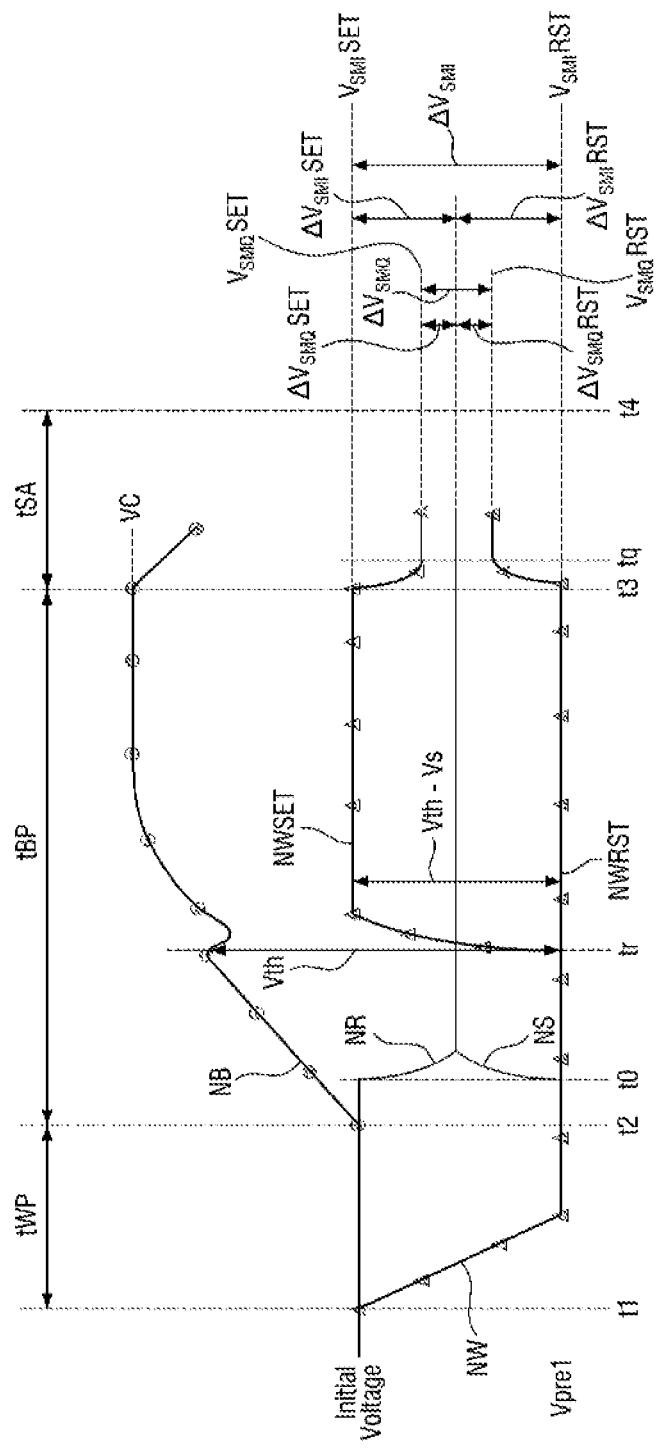
FIG. 10 is a graph explaining an operation of the resistive memory device of FIG. 7.

FIG. 9 is a timing diagram explaining an operation of the resistive memory device of FIG. 7. FIG. 10 is a graph explaining an operation of the resistive memory device of FIG. 7.

Referring to FIGS. 7 to 10, before a first time point t1, the global bit line control voltage GYn, the local bit line control voltage LYn and the clamping activation signal CL_EN become logic high, and the global bit line transistor GPTn, the local bit line transistor LPTn and the clamping switching transistor CST maintain a turn-off state. Therefore, at the first time point t1, the local word line node NW, the bit line node NB, the global word line node NG and the sensing node NS may have an arbitrary initial voltage value. The arbitrary initial voltage value may be, for example, 0 V.

During a word line pre-charge period tWP from the first time point t1 to a second time point t2, the local word line node NW may be pre-charged through a pre-charge voltage (e.g., Vpre1) supplied from the pre-charge unit 240.

In this case, the global bit line transistor GPTn and the local bit line transistor LPTn may be turned on by switching the global bit line control voltage GYn and the local bit line control voltage LYn to logic low at the first time point t1. However, because the clamping activation signal CL_EN maintains logic high from the first time point t1 to the second time point t2, the power supply voltage VP supplied from the power source 200 may not be transferred to the bit line node NB. Accordingly, the bit line node NB maintains an arbitrary initial voltage value until the second time point t2.

Because the global word line control voltage GXn maintains a turn-on state from the first time point t1 to a fourth time point t4, the global word line transistor GNTn may maintain the turn-on state. In order to pre-charge the local word line node NW, the local word line transistor LNTn may be turned on by maintaining the local word line control voltage LXn at logic high during the word line pre-charge period tWP from the first time point t1 to the second time point t2.

The pre-charge voltage (e.g., Vpre1) transferred from the pre-charge unit 240 may be transferred to the local word line node NW through the global word line transistor GNTn and the local word line transistor LNTn. The local word line node NW may be pre-charged from an arbitrary initial voltage value to a pre-charge voltage (e.g., Vpre1) within the word line pre-charge period tWP.

After the local word line node NW is pre-charged to a pre-charge voltage (e.g., Vpre1), the bit line node NB is pre-charged during a bit line pre-charge period tBP from the second time point t2 to a third time point t3. In the resistive memory device according to some embodiments, the local word line node NW may be floated in at least a portion of the bit line pre-charge period tBP.

Specifically, by maintaining the global bit line control voltage GYn and the local bit line control voltage LYn at logic low during the bit line pre-charge period tBP, the global bit line transistor GPTn and the local bit line transistor LPTn may maintain a turn-on state. By maintaining the clamping activation signal CL_EN at logic low during the bit line pre-charge period tBP, the clamping switching transistor CST may maintain a turn-on state.

That is, the power supply voltage VP supplied from the power source 200 may be transferred to the power node NP through the clamping switching transistor CST. Thereafter, the clamping unit 210 may generate the clamping voltage VC for pre-charging the bit line node NB. The clamping unit 210 may transfer the generated clamping voltage VC to the bit line node NB through the global bit line transistor GPTn and the local bit line transistor LPTn to pre-charge the bit line node NB. During the bit line pre-charge period tBP after the second time point t2, the bit line node NB may be pre-charged from the arbitrary initial voltage value to the clamping voltage VC.

At this time, at a time point t0 when the reference voltage transistor is turned on after the second time point t2, in the sense amplifier 230, the reference voltage transistor RVT connected between the reference node NR and the sensing node NS to which the reference voltage Vref is applied may be turned on through the switching voltage VS to make equal the voltage between the sensing node NS and the reference node NR. Thereafter, the sense amplifier 230 compares the voltage (made to be equal) between the sensing node NS and the reference node NR with the voltage of the local word line node NW, thereby sensing whether the resistive memory cell 220 in the SET state or the RST state.

After the time point t0 when the reference voltage transistor is turned on, a voltage difference between the pre-charged local word line node NW and the pre-charged bit line node NB may be a threshold voltage Vth at which the resistive memory cell 220 is turned on. After a threshold voltage time point tr when the voltage difference between the pre-charged local word line node NW and the pre-charged bit line node NB becomes the threshold voltage Vth, the voltage level of the local word line node NW may vary depending on whether the resistive memory cell 220 is in the SET or RST state.

Specifically, when the resistive memory cell 220 is in the SET state, the local word line node NW pre-charged to the pre-charge voltage (e.g., Vpre1) may be charged with charges from the bit line node NB being pre-charged, and the voltage may change along the NWSET graph. When the local word line node NW receives charges from the bit line node NB through the resistive memory cell 220, the charges may be stored in the charging capacitor $C_A$.

If the resistive memory cell 220 is in the RST state, the local word line node NW pre-charged to the pre-charge voltage (e.g., Vpre1) may not be charged with charges from the bit line node NB being pre-charged, and the voltage may be maintained at the pre-charge voltage (e.g., Vpre1) along the NWRST graph. That is, because the resistive memory cell 220 is not turned on, the local word line node NW is maintained at the pre-charge voltage (e.g., Vpre1) as shown in the NWRST graph.

The voltage between the NWSET graph and the NWRST graph may be maintained at a difference between the threshold voltage Vth at which the resistive memory cell 220 is turned on and a hold voltage Vh generated by the resistive memory cell 220 due to a snapback phenomenon.

After the bit line node NB is pre-charged to the clamping voltage VC through the bit line pre-charge period tBP, during a sensing period tSA from the third time point t3 to the fourth time point t4, the charges charged in the charging capacitor CA may be compared with the charges at the sensing node NS, thereby sensing whether the resistive memory cell 220 in the SET state or the RST state.

Specifically, the global bit line transistor GPTn and the local bit line transistor LPTn may be turned off by making the global bit line control voltage GYn and the local bit line control voltage LYn logic high after the third time point t3. That is, it is possible to prevent the clamping voltage VC from being transferred to the bit line node NB. In addition, the clamping activation signal CL_EN may also become logic high, and the power supply voltage VP generated from the power source 200 may not be transferred to the clamping unit 210. That is, the pre-charge of the bit line node NB is stopped.

By maintaining the global word line control voltage GXn at logic high until the fourth time point t4, the global word line transistor GNTn may maintain a turn-on state. The local word line control voltage LXn may become logic high at the third time point t3 and may maintain logic high until the fourth time point t4. That is, during the sensing period tSA, the local word line transistor LNTn and the global word line transistor GNTn may be turned on to move the charges charged in the local word line node NW to the sensing node NS.

However, according to Equation 1, the total amount of charges charged in the charging capacitor $C_A$ should be the same as the amount of charges stored in the charging capacitor $C_A$ and the parasitic capacitance $C_{PAR}$ connected in parallel when the local word line transistor LNTn is turned on.

$$C_A*(Vth-Vs)=(C_A+C_{PAR})*(\Delta V_{SMQ}) \qquad \text{Equation 1}$$

When the local word line transistor LNTn is turned on, a charge sharing phenomenon may occur between the charging capacitor $C_A$ and the parasitic capacitance $C_{PAR}$ formed at the global word line node NG.

That is, after the third time point t3, the local word line transistor LNTn may be turned on to form a parallel connection between the charging capacitor $C_A$ and the parasitic capacitance $C_{PAR}$. Due to the charge sharing, the NW SET graph of the local word line node NW may have a SET charge sharing voltage $V_{SMQ}SET$ according to the charge sharing at a charge sharing time point tq after the third time point t3 at which sensing starts. Similarly, due to the charge sharing, the NWRST graph of the local word line node NW may have an RST charge sharing voltage $V_{SMQ}RST$ according to the charge sharing at the charge sharing time point tq after the third time point t3 at which sensing starts.

If the charge sharing due to the parasitic capacitance $C_{PAR}$ does not occur, the voltage of the local word line node NW in the SET state may maintain a SET ideal voltage $V_{SMI}SET$ even in the sensing period tSA. That is, a SET sensing margin between the voltage of the sensing node NS and the voltage of the local word line node NW, through which the sense amplifier 230 can determine whether the resistive memory cell 220 is in the SET state, can be maintained to a high value, such as a SET ideal margin $\Delta V_{SMI}SET$.

However, when charge sharing occurs due to the parasitic capacitance $C_{PAR}$, the voltage of the local word line node NW may have the SET charge sharing voltage $V_{SMQ}SET$ lower than the SET ideal voltage $V_{SMI}SET$ after the charge sharing time point tq. That is, the SET sensing margin between the voltage of the sensing node NS and the voltage of the local word line node NW, through which the sense amplifier 230 can determine whether the resistive memory cell 220 is in the SET state, has a SET charge sharing margin $\Delta V_{SMQ}SET$ lower than the SET ideal voltage $V_{SMI}SET$. Accordingly, the reliability of the result obtained by the sense amplifier 230 determining whether the resistive memory cell 220 is in the SET state may be lowered.

Similarly, if the charge sharing due to the parasitic capacitance $C_{PAR}$ does not occur, the voltage of the local word line node NW in the RST state may maintain an RST ideal voltage $V_{SMI}RST$ even in the sensing period tSA. That is, an RST sensing margin between the voltage of the sensing node NS and the voltage of the local word line node NW, through which the sense amplifier 230 can determine whether the resistive memory cell 220 is in the RST state, can be maintained to a high value, such as an RST ideal margin $\Delta V_{SMI}RST$.

However, when charge sharing occurs due to the parasitic capacitance $C_{PAR}$, the voltage of the local word line node NW may have the RST charge sharing voltage $V_{SMQ}RST$ lower than the RST ideal voltage $V_{SMI}RST$ after the charge sharing time point tq. That is, the RST sensing margin between the voltage of the sensing node NS and the voltage of the local word line node NW, through which the sense amplifier 230 can determine whether the resistive memory cell 220 is in the RST state, has an RST charge sharing margin $\Delta V_{SMQ}RST$ lower than the RST ideal margin $\Delta V_{SMI}RST$. Accordingly, the reliability of the result obtained by the sense amplifier 230 determining whether the resistive memory cell 220 is in the RST state may be lowered.

That is, the sensing margin for the sense amplifier 230 to determine whether the resistive memory cell 220 is in the SET state or the RST state decreases from the ideal margin $\Delta V_{SMI}$ to the charge sharing margin $\Delta V_{SMQ}$ due to the charge sharing between the parasitic capacitance $C_{PAR}$ and the charging capacitor $C_A$, and the reliability of the resistive memory device may be reduced.

Hereinafter, a resistive memory device according to some embodiments for preventing a sensing margin from decreasing due to charge sharing will be described.

Figure 11:
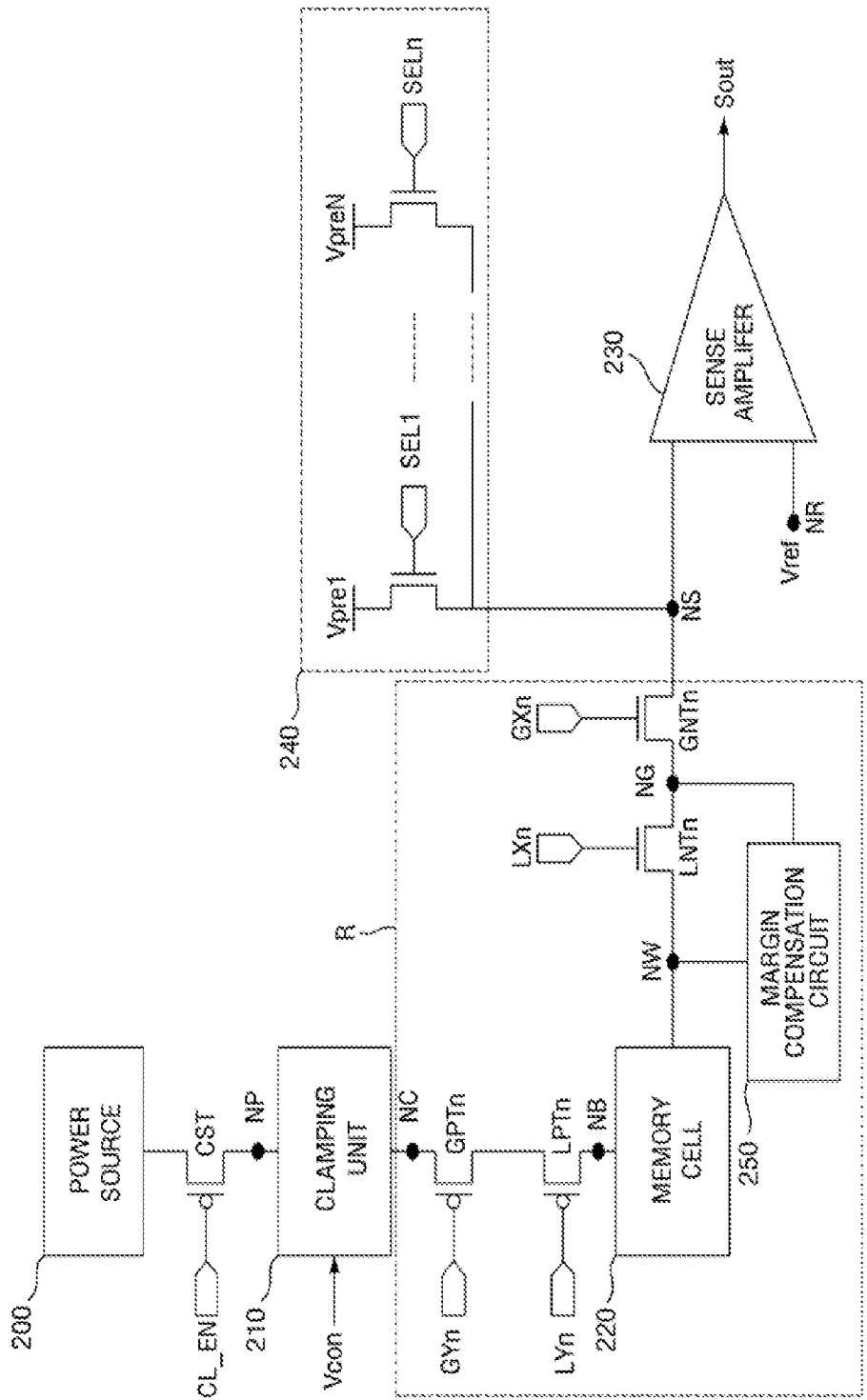
FIG. 11 is a block diagram illustrating a resistive memory device according to some embodiments.
Figure 12:
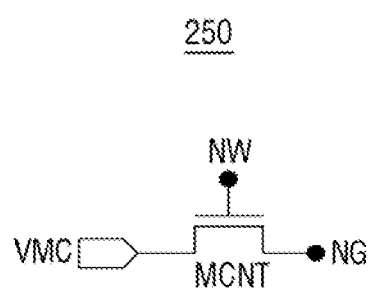
FIG. 12 is an exemplary circuit diagram illustrating a margin compensation switch in a margin compensation circuit of the resistive memory device of FIG. 11, according to some embodiments.

FIG. 11 is a block diagram illustrating a resistive memory device according to some embodiments. FIG. 12 is an exemplary circuit diagram illustrating a margin compensation switch in a margin compensation circuit of the resistive memory device of FIG. 11, according to some embodiments. In the following description, a redundant description will be omitted and differences will be mainly described.

Referring to FIG. 11, unlike the case of FIG. 7, a margin compensation circuit 250 may be connected to the local word line node NW and the global word line node NG. The margin compensation circuit 250 may include a margin compensation switch. The margin compensation switch may be a margin compensation NMOS transistor MCNT, as shown in FIG. 12. The margin compensation switch may be a PMOS transistor or a transfer transistor, but is not limited thereto.

In addition, unlike the case of FIG. 7, in the resistive memory device of FIG. 11 according to some embodiments, a circuit for switching between the reference node NR and the sensing node NS of the sense amplifier 230 may be omitted. That is, the sense amplifier 230 may sense a difference between the reference voltage Vref and the voltage of the sensing node NS, and output the result of determining whether the resistive memory cell 220 is in the SET state or the RST state as the sensing output value Sout.

Referring to FIG. 12, the margin compensation NMOS transistor MCNT in the margin compensation circuit 250 may be gated by the local word line node NW to transmit a margin compensation voltage VMC connected to the drain to the global word line node NG. When the margin compensation switch is a PMOS transistor, the margin compensation voltage VMC connected to the source may be transmitted to the global word line node NG. The operation of the margin compensation switch is not limited thereto, and other switching operations according to switch configurations are possible as long as the switching operation is gated by the local word line node NW to transmit the margin compensation voltage VMC to the global word line node NG.

Figure 13:
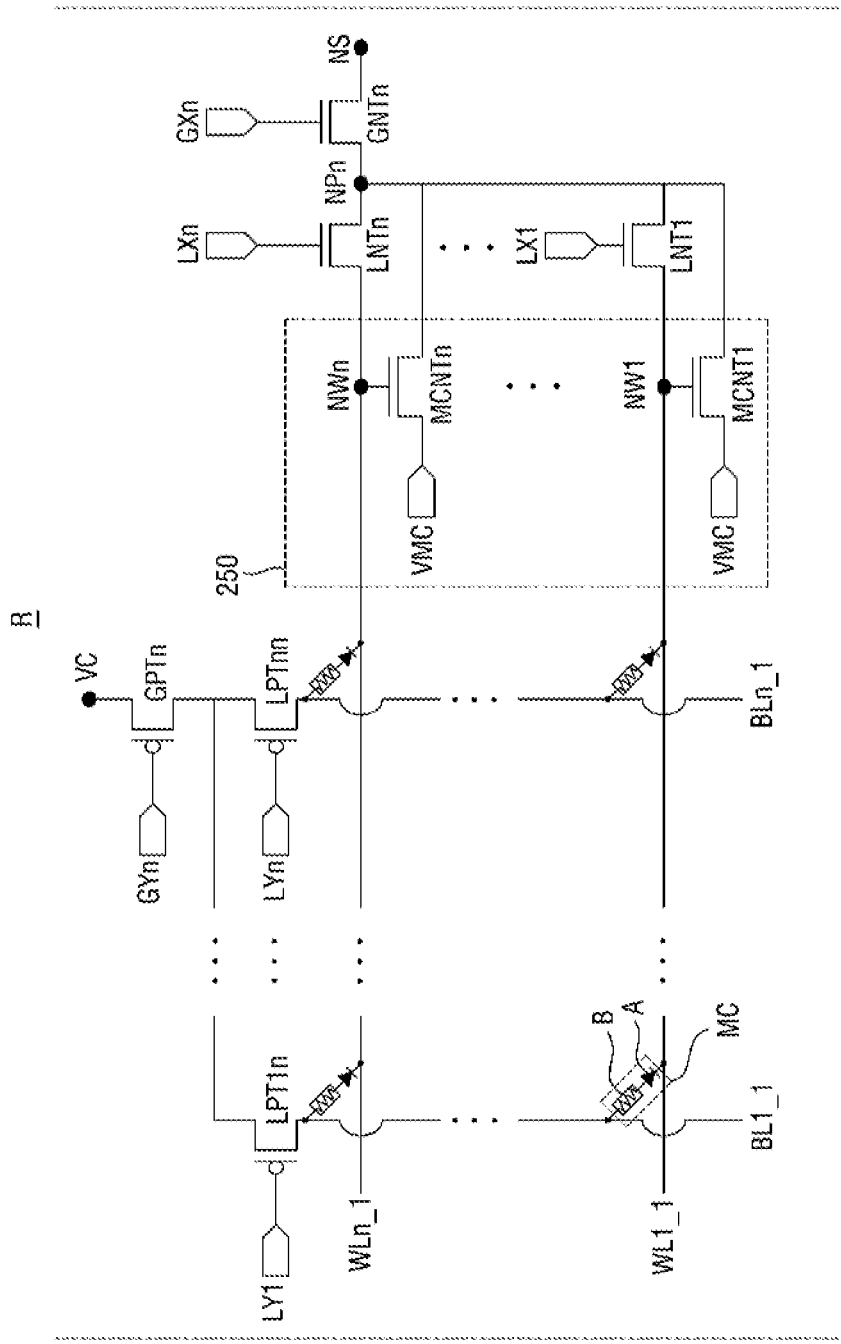
FIG. 13 is an exemplary circuit diagram illustrating a region of the resistive memory device of FIG. 11, according to some embodiments.

FIG. 13 is an exemplary circuit diagram illustrating region R of the resistive memory device of FIG. 11, according to some embodiments. According to some embodiments discussed below and illustrated in FIG. 13, the margin compensation circuit 250 may be connected to the resistive memory device. Hereinafter, a description will be given on the assumption that the margin compensation switch in the margin compensation circuit 250 is the margin compensation NMOS transistor MCNT.

Referring to FIGS. 11 to 13, in the region R, a resistive memory cell layer may be connected between the global bit line transistor GPTn which receives the clamping voltage VC from the clamping unit 210, and the global word line transistor GNTn which receives a pre-charge voltage from the sensing node NS.

Specifically, a plurality of local bit line transistors LPT1n to LPTnn may be connected to the global bit line transistor GPTn. The plurality of local bit line transistors LPT1n to LPTnn may transmit the clamping voltage VC received from the global bit line transistor GPTn to a plurality of bit lines BL1_1 to BLn_1 connected thereto, respectively.

In addition, a plurality of local word line transistors LNT1 to LNTn may be connected to the global word line transistor GNTn. The plurality of local word line transistors LNT1 to LNTn may transmit the pre-charge voltage (e.g., Vpre1) received from the global word line transistor GNTn to a plurality of word lines WL1_1 to WLn_1 connected thereto, respectively.

As described above with reference to FIG. 2, one resistive memory cell 220 may be formed at the intersection of each bit line and each word line. A detailed description thereof will be omitted because it is the same as that described with reference to FIG. 2.

The margin compensation circuit 250 of the resistive memory device according to some embodiments may include a plurality of margin compensation switches gated by the plurality of local word line nodes MW1 to MWn, respectively. In the drawing, the plurality of margin compensation switches are illustrated as a plurality of margin compensation NMOS transistors MCNT1 to MCNTn.

The source of each of the margin compensation NMOS transistors MCNT1 to MCNTn may be connected to the global word line node NGn. That is, the respective margin compensation NMOS transistors MCNT1 to MCNTn may be gated by the plurality of local word line nodes NW to transmit the margin compensation voltage VMC to the global word line node NG.

By connecting the margin compensation circuit 250 between the local word line node NW and the global word line node NG, the margin reduction described above with reference to FIG. 7 can be prevented. A detailed description thereof will be given with reference to FIGS. 14 and 15.

Figure 14:
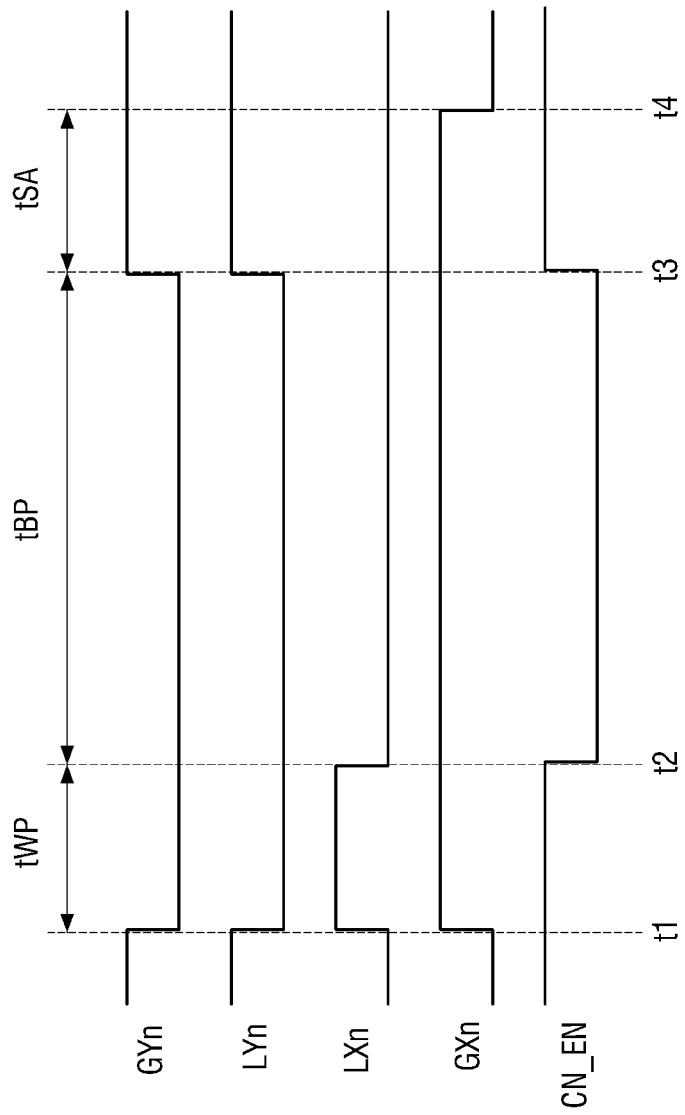
FIG. 14 is a timing diagram illustrating an operation of the resistive memory device of FIG. 11, according to some embodiments.
Figure 15:
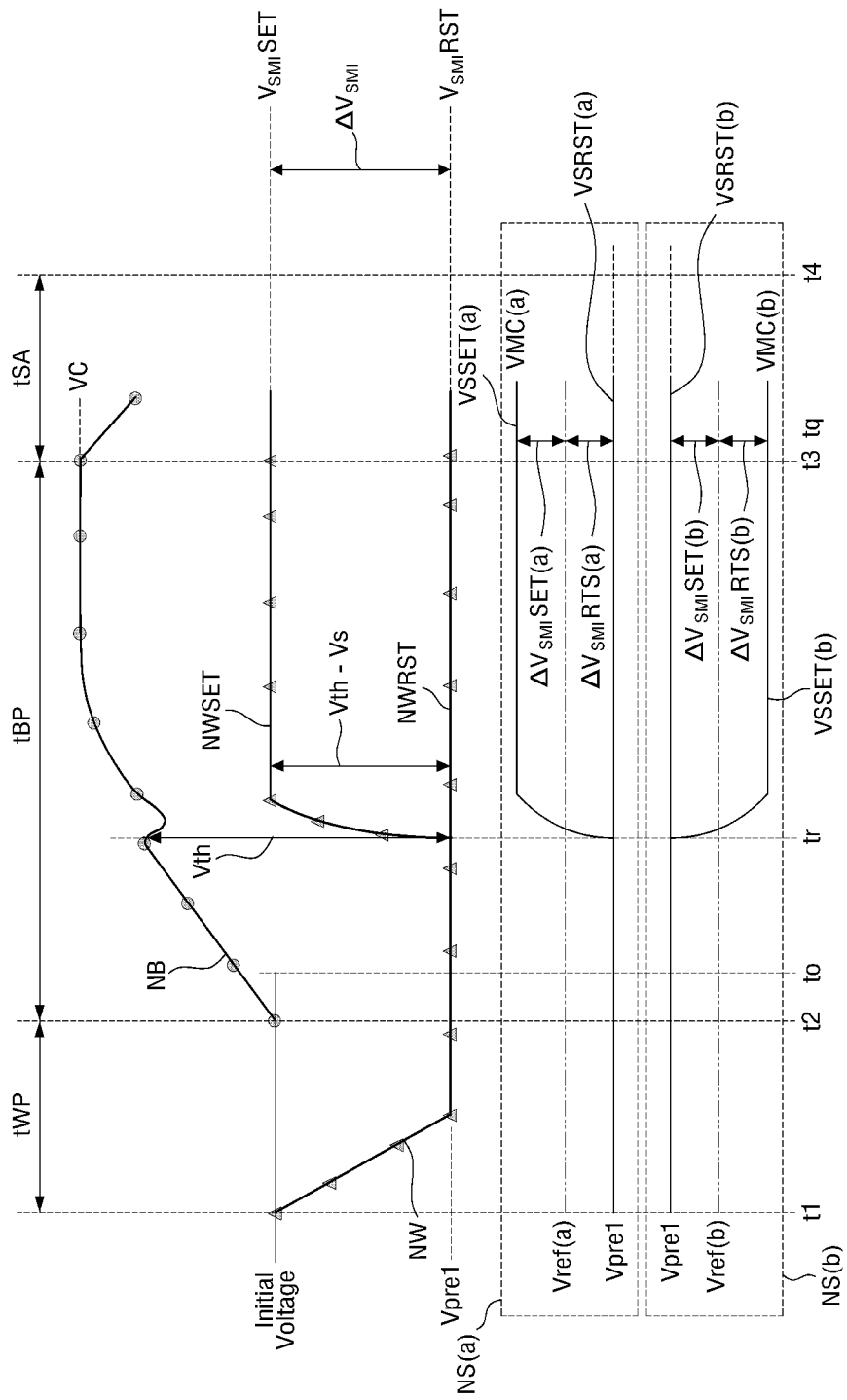
FIG. 15 is a graph explaining an operation of a resistive memory device including the margin compensation circuit of FIG. 13, according to some embodiments.

FIG. 14 is a timing diagram illustrating an operation of the resistive memory device of FIG. 11, according to some embodiments. FIG. 15 is a graph explaining an operation of a resistive memory device including the margin compensation circuit of FIG. 13, according to some embodiments. For simplicity, a description overlapping with the description with reference to FIGS. 7 to 10 will be omitted.

Hereinafter, it is assumed that the local bit line node NB, the local bit line transistor LPTn, the local word line node NW, and the local word line transistor LNTn are a $n^{th}$ local bit line node LBn, a $n^{th}$ local word line transistor LPTn, a $n^{th}$ local word line node NWn, and a $n^{th}$ local word line transistor LNTn among a plurality of local bit line nodes, a plurality of local bit line transistors LPT1n to LPTnn, a plurality of local word line nodes MW1 to MWn, and a plurality of local word line transistors MCPT1 to MCPTn, respectively.

Referring to FIGS. 11 to 14, as for the global bit line control voltage GYn, the local bit line control voltage LYn, the global word line control voltage GXn, the local word line control voltage LXn, and the clamping activation signal CL_EN, logic value changes in the word line pre-charge period tWP and the bit line pre-charge period tBP are the same as those described with reference to FIG. 9. As for the global bit line control voltage GYn, the local bit line control voltage LYn, the global word line control voltage GXn, and the clamping activation signal CL_EN, logic value changes in the sensing period tSA are also the same as those described with reference to FIG. 9.

However, in the sensing period tSA, the local word line control voltage LXn of the resistive memory device according to some embodiments remains at a logic low, unlike the case of FIG. 9, and the local word line transistor LNTn is turned off That is, in FIG. 9, as the local word line control voltage LXn becomes logic high during the sensing period tSA, and the local word line transistor LNTn is turned on, the local word line node NW share charges with the global word line node NG, thereby causing a decrease in sensing margin.

However, in the resistive memory device timing of FIG. 14 according to some embodiments, the local word line transistor LNTn may be turned off by maintaining the local word line control voltage LXn at logic low during the sensing period tSA. Accordingly, charge sharing between the local word line node NW and the global word line node NG does not occur in the sensing period tSA, thereby preventing a reduction in sensing margin. This will be described in more detail with reference to FIG. 15. A description overlapping with the description with reference to FIGS. 7 to 10 will be omitted.

Referring to FIGS. 11 to 15, the sensing margin may maintain the ideal margin $\Delta V_{SMI}$ by turning off the local word line transistor LNTn during the sensing period tSA.

That is, because charge sharing does not occur between the local word line node NW and the global word line node NG, the NWSET graph may maintain the SET ideal voltage $V_{SMI}$SET even after the sensing period tSA. In addition, because charge sharing does not occur between the local word line node NW and the global word line node NG, the NWRST graph may maintain the RST ideal voltage $V_{SMI}$RST even after the sensing period tSA.

The sensing operation of the sense amplifier 230 may be performed along a sensing node graph NS(a) when the pre-charge voltage (e.g., Vpre1) is smaller than a first margin compensation voltage VMC(a) or a sensing node graph NS(b) when the pre-charge voltage (e.g., Vpre1) is greater than a second margin compensation voltage VMC(b).

First, in the graph NS(a), the sensing node NS may have the pre-charge voltage (e.g., Vpre1) provided by the pre-charge unit 240 from the first time point t1. Thereafter, a margin compensation NMOS switch may be gated by the local word line node NW at the threshold voltage time point tr to transmit the first margin compensation voltage VMC(a) to the global word line node NG. That is, the sensing node NS may have a graph such as VSSET(a). If the margin compensation NMOS switch is not gated by the local word line node NW at the threshold voltage time point tr, the sensing node NS maintains the pre-charge voltage (e.g., Vpre1) and may have a graph such as VSRST(a).

A first reference voltage Vref may be set in consideration of the first margin compensation voltage VMC(a) such that a first SET ideal margin $\Delta V_{SMI}$SET(a) and a first RST ideal margin $\Delta V_{SMI}$RST(a) have sufficiently large values. That is, the resistive memory device according to some embodiments may separately perform the operation of sensing whether the resistive memory cell 220 is in the SET state or the RST state, without turning on the local word line transistor LNTn. Therefore, the first reference voltage Vref and the first margin compensation voltage VMC(a) are designated to have the sensing margin required by the user while not losing the charges at the local word line node NW, thereby improving the reliability of the resistive memory device according to some embodiments.

Next, in the graph NS(b), the sensing node NS may have the pre-charge voltage (e.g., Vpre1) provided by the pre-charge unit 240 from the first time point t1. Thereafter, the margin compensation NMOS switch may be gated by the local word line node NW at the threshold voltage time point tr to transmit the second margin compensation voltage VMC(b) to the global word line node NG. That is, the sensing node NS may have a graph such as VSSET(b). If the margin compensation NMOS switch is not gated by the local word line node NW at the threshold voltage time point tr, the sensing node NS maintains the pre-charge voltage (e.g., Vpre1) and may have a graph such as VSRST(b).

A second reference voltage Vref may be set in consideration of the second margin compensation voltage VMC(b) such that a second SET ideal margin $\Delta V_{SMI}$SET(b) and a second RST ideal margin $\Delta V_{SMI}$RST(b) have sufficiently large values. That is, the resistive memory device according to some embodiments may separately perform the operation of sensing whether the resistive memory cell 220 is in the SET state or the RST state, without turning on the local word line transistor LNTn. Therefore, the second reference voltage Vref and the second margin compensation voltage VMC(b) are designated to have the sensing margin required by the user while not losing the charges at the local word line node NW, thereby improving the reliability of the resistive memory device according to some embodiments.

Figure 16:
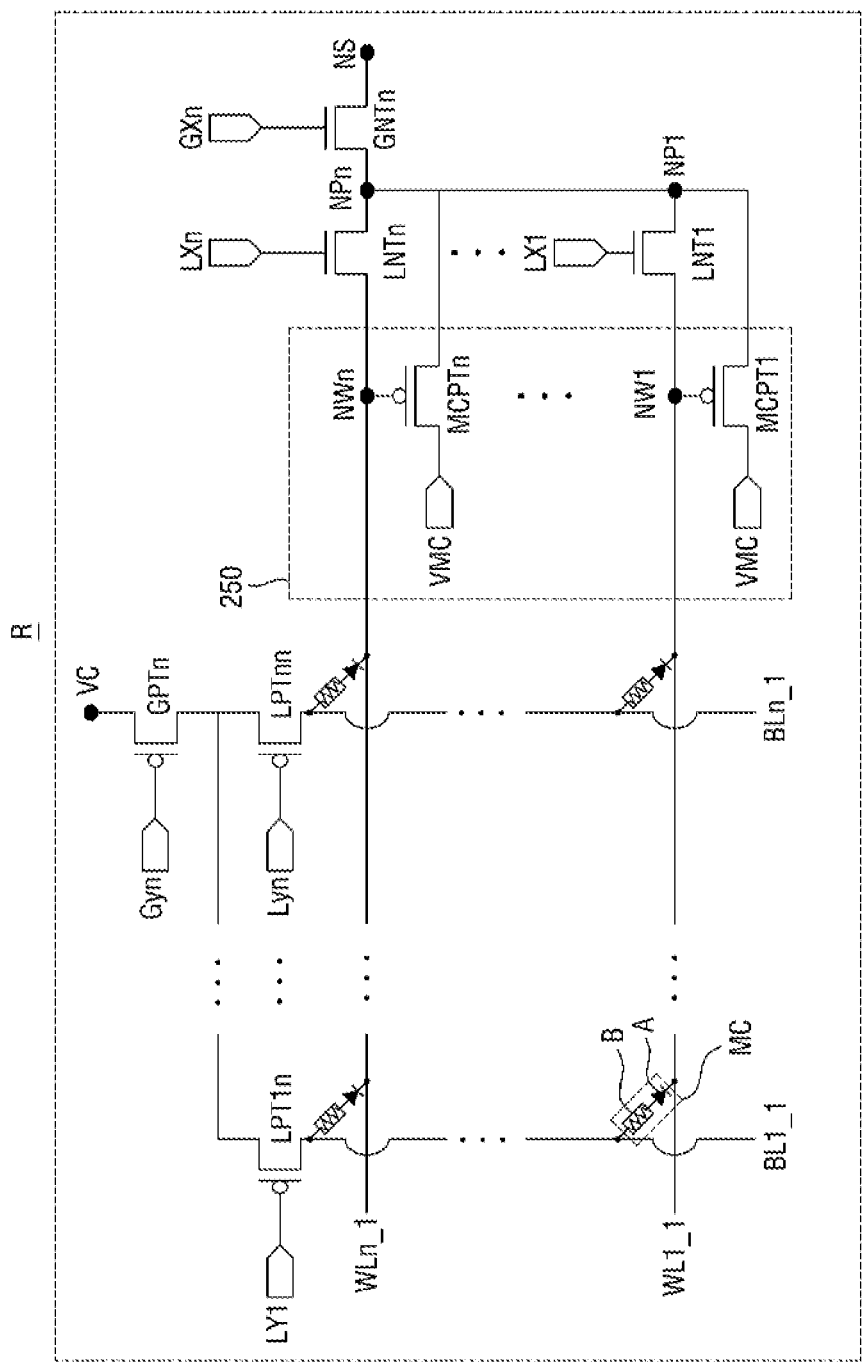
FIG. 16 is another exemplary circuit diagram illustrating a region of the resistive memory device of FIG. 11, according to some embodiments.

FIG. 16 is another exemplary circuit diagram illustrating region R of the resistive memory device of FIG. 11, according to some embodiments. For reference, it has the same configuration as that of FIG. 13 except that the margin compensation transistors are PMOS transistors and include a plurality of margin compensation transistors MCPT1 to MCPTn.

In the region R, a resistive memory cell layer may be connected between the global bit line transistor GPTn which receives the clamping voltage VC from the clamping unit 210, and the global word line transistor GNTn which receives a pre-charge voltage from the sensing node NS.

Specifically, a plurality of local bit line transistors LPT1n to LPTnn may be connected to the global bit line transistor GPTn. The plurality of local bit line transistors LPT1n to LPTnn may transmit the clamping voltage VC received from the global bit line transistor GPTn to a plurality of bit lines BL1_1 to BLn_1 connected thereto, respectively.

In addition, a plurality of local word line transistors LNT1 to LNTn may be connected to the global word line transistor GNTn. The plurality of local word line transistors LNT1 to LNTn may transmit the pre-charge voltage (e.g., Vpre1) received from the global word line transistor GNTn to a plurality of word lines WL1_1 to WLn_1 connected thereto, respectively.

As described above with reference to FIG. 2, one resistive memory cell 220 may be formed at the intersection of each bit line and each word line. A detailed description thereof will be omitted because it is the same as that described with reference to FIG. 2.

The margin compensation circuit 250 of the resistive memory device according to some embodiments may include a plurality of margin compensation switches gated by the plurality of local word line nodes MW1 to MWn, respectively. In the drawing, the plurality of margin compensation switches are illustrated as a plurality of margin compensation PMOS transistors MCPT1 to MCPTn.

The drain of each of the margin compensation PMOS transistors MCPT1 to MCPTn may be connected to the global word line node NGn. That is, the respective margin compensation PMOS transistors MCPT1 to MCPTn may be gated by the plurality of local word line nodes NW to transmit the margin compensation voltage VMC to the global word line node NG.

By connecting the margin compensation circuit 250 between the local word line node NW and the global word line node NG, the margin reduction described above with reference to FIG. 7 can be prevented. A detailed description thereof will be given with reference to FIGS. 11, 12, 14 and 16.

Figure 17:
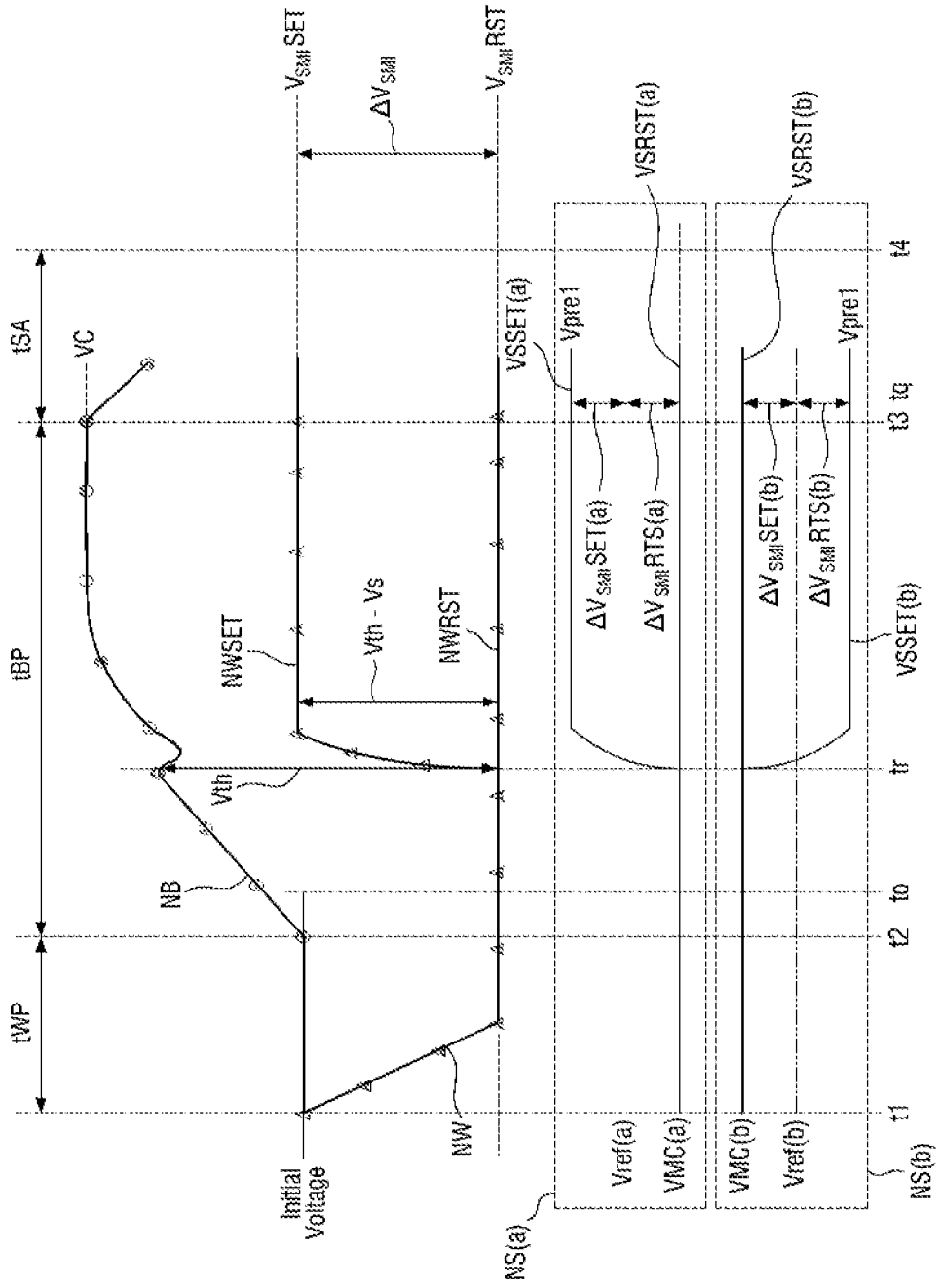
FIG. 17 is a graph explaining an operation of a resistive memory device including the margin compensation circuit of FIG. 16, according to some embodiments.

FIG. 17 is a graph explaining an operation of a resistive memory device including the margin compensation circuit of FIG. 16, according to some embodiments.

Referring to FIGS. 11, 12, 14, 16 and 17, as for the global bit line control voltage GYn, the local bit line control voltage LYn, the global word line control voltage GXn, the local word line control voltage LXn, and the clamping activation signal CL_EN, logic value changes in the word line pre-charge period tWP and the bit line pre-charge period tBP are the same as those described with reference to FIG. 9. As for the global bit line control voltage GYn, the local bit line control voltage LYn, the global word line control voltage GXn, and the clamping activation signal CL_EN, logic value changes in the sensing period tSA are also the same as those described with reference to FIG. 9.

However, in the sensing period tSA, the local word line control voltage LXn of the resistive memory device according to some embodiments remains a logic low unlike the case of FIG. 9, and the local word line transistor LNTn remains turned off.

That is, in FIG. 9, as the local word line control voltage LXn becomes logic high during the sensing period tSA, and the local word line transistor LNTn is turned on, the local word line node NW share charges with the global word line node NG, thereby causing a decrease in sensing margin.

However, in the resistive memory device of FIG. 14 according to some embodiments, the local word line transistor LNTn may be turned off by maintaining the local word line control voltage LXn at logic low during the sensing period tSA. Accordingly, charge sharing between the local word line node NW and the global word line node NG does not occur in the sensing period tSA, thereby preventing a reduction in sensing margin. This will be described in more detail with reference to FIG. 17. A description overlapping with the description with reference to FIGS. 7 to 10 will be omitted.

Referring to FIGS. 11, 12, 14, 16 and 17, by turning off the local word line transistor LNTn during the sensing period tSA, the sensing margin may maintain the ideal margin $\Delta V_{SMI}$. That is, because charge sharing does not occur between the local word line node NW and the global word line node NG, the NWSET graph may maintain the SET ideal voltage $V_{SMI}SET$ even after the sensing period tSA. In addition, because charge sharing does not occur between the local word line node NW and the global word line node NG, the NWRST graph may maintain the RST ideal voltage $V_{SMI}RST$ even after the sensing period tSA.

The sensing operation of the sense amplifier 230 may be performed along a sensing node graph NS(a) when the pre-charge voltage (e.g., Vpre1) is greater than a first margin compensation voltage VMC(a) or a sensing node graph NS(b) when the pre-charge voltage (e.g., Vpre1) is smaller than a second margin compensation voltage VMC(b).

First, in the graph NS(a), the sensing node NS may have the first margin compensation voltage VMC(a) connected to the source of the margin compensation PMOS transistor MCPTn from the first time point t1. Unlike the case of FIG. 15, the margin compensation switch of the margin compensation circuit 250 is a PMOS transistor. Accordingly, when the resistive memory cell 220 has a voltage lower than the threshold voltage, charges may not be transferred from the bit line node NB to the local word line node NW. In this case, logic low is applied to the margin compensation PMOS transistor MCPTn, and the margin compensation PMOS transistor may be turned on. That is, from the first time point t1 to the threshold voltage time point tr at which a voltage greater than or equal to the threshold voltage Vth is applied to the resistive memory cell 220, the first margin compensation voltage VMC(a) may be transferred to the sensing node NS through the margin compensation PMOS transistor MCPTn. Thereafter, the margin compensation PMOS switch may be turned off by the local word line node NW at the threshold voltage time point tr to apply the pre-charge voltage (e.g., Vpre1) supplied from the pre-charge unit 240 to the sensing node NS.

That is, when the resistive memory cell 220 is in the SET state, the sensing node NS may have a graph such as VSSET(a). If the margin compensation PMOS switch MCPTn is not turned off by the local word line node NW at the threshold voltage time point tr, the sensing node NS maintains the first margin compensation voltage VMC(a) and may have a graph such as VSRST(a).

The first reference voltage Vref may be set in consideration of the first margin compensation voltage VMC(a) such that a first SET ideal margin $\Delta V_{SMI}SET(a)$ and a first RST ideal margin $\Delta V_{SMI}RST(a)$ have sufficiently large values. That is, the resistive memory device according to some embodiments may separately perform the operation of sensing whether the resistive memory cell 220 is in the SET state or the RST state, without turning on the local word line transistor LNTn. Therefore, the first reference voltage Vref and the first margin compensation voltage VMC(a) are designated to have the sensing margin required by the user while not losing the charges at the local word line node NW, thereby improving the reliability of the resistive memory device according to some embodiments.

Next, in the graph NS(b), the sensing node NS may have the second margin compensation voltage VMC(b) connected to the source of the margin compensation PMOS transistor MCPTn from the first time point t1. Unlike the case of FIG. 15, the margin compensation switch of the margin compensation circuit 250 is a PMOS transistor. Accordingly, when the resistive memory cell 220 has a voltage lower than the threshold voltage, charges may not be transferred from the bit line node NB to the local word line node NW. In this case, logic low is applied to the margin compensation PMOS transistor MCPTn, and the margin compensation PMOS transistor may be turned on. That is, from the first time point t1 to the threshold voltage time point tr at which a voltage greater than or equal to the threshold voltage Vth is applied to the resistive memory cell 220, the first margin compensation voltage VMC(a) may be transferred to the sensing node NS through the margin compensation PMOS transistor MCPTn. Thereafter, the margin compensation PMOS switch may be turned off by the local word line node NW at the threshold voltage time point tr to apply the pre-charge voltage (e.g., Vpre1) supplied from the pre-charge unit 240 to the sensing node NS.

That is, when the resistive memory cell 220 is in the SET state, the sensing node NS may have a graph such as VSSET(b). If the margin compensation PMOS switch MCPTn is not turned off by the local word line node NW at the threshold voltage time point tr, the sensing node NS maintains the second margin compensation voltage VMC(b) and may have a graph such as VSRST(b).

A second reference voltage Vref may be set in consideration of the second margin compensation voltage VMC(b) such that a second SET ideal margin $\Delta V_{SM}SET(b)$ and a second RST ideal margin $\Delta V_{SM}RST(b)$ have sufficiently large values. That is, the resistive memory device according to some embodiments may separately perform the operation of sensing whether the resistive memory cell 220 is in the SET state or the RST state, without turning on the local word line transistor LNTn. Therefore, the second reference voltage Vref and the second margin compensation voltage VMC(b) are designated to have the sensing margin required by the user while not losing the charges at the local word line node NW, thereby improving the reliability of the resistive memory device according to some embodiments.

While embodiments have been described, those skilled in the art will appreciate that many variations and modifications can be made without departing from the principles of the present disclosure.

What is claimed is:

1. A resistive memory device comprising:
   a resistive memory cell electrically connected to a local word line node;
   a local word line transistor configured to electrically connect the local word line node to a global word line node;
   a global word line transistor configured to electrically connect the global word line node to a sensing node; and
   a margin compensation circuit comprising a margin compensation switch electrically connected to the local word line node and the global word line node, wherein the margin compensation switch is configured to provide a margin compensation voltage to the global word line node based on a voltage applied to the local word line node.

2. The resistive memory device of claim 1, further comprising a word line pre-charge circuit configured to provide a pre-charge voltage to the sensing node.

3. The resistive memory device of claim 2, wherein the margin compensation voltage is greater than the pre-charge voltage.

4. The resistive memory device of claim 2, wherein the margin compensation voltage is less than the pre-charge voltage.

5. The resistive memory device of claim 4, wherein the margin compensation voltage corresponds to a ground voltage.

6. The resistive memory device of claim 1, wherein the margin compensation switch is further configured to provide a-the margin compensation voltage to the global word line node based on the voltage applied to the local word line node being a ground voltage.

7. A resistive memory device comprising:
   a resistive memory cell electrically connected to a bit line and a word line, the resistive memory cell being connected to the word line at a local word line node, and the resistive memory cell comprising an access element having a first threshold voltage;
   a local word line transistor configured to electrically connect the local word line node to a global word line node from a first time point to a second time point to pre-charge the word line to a pre-charge voltage;
   a global word line transistor configured to electrically connect the global word line node to a sensing node;
   a word line pre-charge circuit configured to generate the pre-charge voltage and provide the pre-charge voltage to the sensing node; and
   a margin compensation switch electrically connected to the global word line node, the margin compensation switch being configured to operate according to a voltage applied to the local word line node,
   wherein the local word line transistor is further configured to maintain an off state after the second time point while the global word line transistor electrically connects the global word line node to the sensing node,
   wherein the margin compensation switch is further configured to provide a margin compensation voltage to the global word line node at a third time point, and
   wherein the margin compensation voltage is greater than the pre-charge voltage.

8. The resistive memory device of claim 7, wherein the margin compensation switch is further configured to provide a-the margin compensation voltage to the global word line node from the first time point to a-the third time point, and wherein the pre-charge voltage is provided to the global word line node after the third time point.

9. The resistive memory device of claim 7, wherein after the word line is pre-charged to the pre-charge voltage, the voltage of the global word line node becomes a-the margin compensation voltage after a-the third time point at which a voltage difference between the bit line and the word line becomes the first threshold voltage.

10. The resistive memory device of claim 9, wherein the pre-charge voltage is less than 0.

11. The resistive memory device of claim 9, wherein the margin compensation voltage corresponds to a ground voltage.

12. The resistive memory device of claim 7, wherein after the second time point, the word line is floated during at least a portion of a bit line pre-charge period in which the bit line is pre-charged to a clamping voltage.

13. A resistive memory device comprising:
    a power source;
    a resistive memory cell electrically connected to a local bit line node and a local word line node;

a clamping circuit configured to provide a clamping voltage based on power received from the power source;

a global bit line transistor configured to receive the clamping voltage from the clamping circuit;

a local bit line transistor configured to receive the clamping voltage from the global bit line transistor and provide the clamping voltage to the resistive memory cell;

a local word line transistor interposed between a-the local word line node and a global word line node;

a global word line transistor interposed between the global word line node and a sensing node;

a margin compensation circuit electrically connected to the local word line node and the global word line node, the margin compensation circuit comprising a margin compensation switch that is configured to operate according to a voltage applied to the local word line node;

a word line pre-charge circuit electrically connected to the sensing node; and a sense amplifier comprising a first terminal connected to the sensing node and a second terminal connected to a reference node, wherein the word line pre-charge circuit is configured to provide a pre-charge voltage to the sensing node, wherein the margin compensation switch is further configured to provide a margin compensation voltage to the global word line node, and wherein the margin compensation voltage is greater than the pre-charge voltage.

14. The resistive memory device of claim 13, wherein the margin compensation voltage is less than the pre-charge voltage.

* * * * *